United States Patent [19]
Burger et al.

[11] Patent Number: 5,482,878
[45] Date of Patent: Jan. 9, 1996

[54] METHOD FOR FABRICATING INSULATED GATE FIELD EFFECT RANSISTOR HAVING SUBTHRESHOLD SWING

[75] Inventors: Vida I. Burger; Michael H. Kaneshiro, both of Phoenix; Diann Dow, Chandler; Kevin M. Klein, Tempe; Michael P. Masquelier; E. James Prendergast, both of Phoenix, all of Ariz.

[73] Assignee: Motorola, Inc., Schaumburg, Ill.

[21] Appl. No.: 223,393

[22] Filed: Apr. 4, 1994

[51] Int. Cl.$^6$ .................................................. H01L 21/265
[52] U.S. Cl. ................................. 437/41; 437/44; 437/45
[58] Field of Search .................................. 437/41, 45, 44, 437/29, 57

[56] References Cited

U.S. PATENT DOCUMENTS

| | | |
|---|---|---|
| 4,062,699 | 12/1977 | Armstrong . |
| 4,385,947 | 5/1983 | Halfacre et al. ............................ 437/45 |
| 4,459,741 | 7/1984 | Schwabe et al. ........................... 437/45 |
| 4,898,835 | 2/1990 | Cawlfield . |
| 4,949,136 | 8/1990 | Jain . |
| 4,968,639 | 11/1990 | Bergonzoni . |
| 5,134,085 | 7/1992 | Gilgen et al. .............................. 437/57 |
| 5,147,811 | 9/1992 | Sakagami . |
| 5,153,144 | 10/1992 | Komori et al. ............................ 437/44 |
| 5,162,884 | 11/1992 | Liou et al. . |
| 5,166,087 | 11/1992 | Kakimoto et al. . |
| 5,171,700 | 12/1992 | Zamanian . |
| 5,182,619 | 1/1993 | Pfiester . |
| 5,202,276 | 4/1993 | Malhi . |
| 5,248,627 | 9/1993 | Williams . |
| 5,254,487 | 10/1993 | Tamagawa ............................... 437/45 |
| 5,258,635 | 11/1993 | Nitayama et al. . |
| 5,268,324 | 12/1993 | Aitken et al. ............................. 437/45 |
| 5,270,235 | 12/1993 | Ito ........................................... 437/45 |
| 5,372,960 | 12/1994 | Davies et al. ............................ 437/45 |

OTHER PUBLICATIONS

C. F. Codella et al., "Submicron IGFET Device with Double Implanted Lightly Doped Drain/Source Structure", IBM Technical Disclosure Bulletin, vol. 26, No. 12, May 1984, pp. 6584–6586.

H. Yoshimura et al., "New CMOS Shallow Junction Well FET Structure (CMOS–SJET) for Low Power–Supply Voltage", IEEE, 1992, pp. 909–912.

Primary Examiner—Olik Chaudhuri
Assistant Examiner—Brian K. Dutton
Attorney, Agent, or Firm—Rennie William Dover

[57] ABSTRACT

Insulated gate field effect transistors (10, 70) having process steps for setting the $V_T$ and a device leakage current which are decoupled from the process steps for providing punch-through protection, thereby lowering a subthreshold swing. In a unilateral transistor (10), a portion (37, 45) of a dopant layer (25, 30) between a source region (48, 51) and a drain region (49, 52) serves as a channel region and sets the $V_T$ and the device leakage current. A halo region (34, 39) contains the source region (48, 51) and sets the punch-through voltage. In a bilateral transistor (70), both a source region (83, 86) and a drain region (84, 87) are contained within halo regions (75, 74, 79, 81). A portion (76, 82) of a dopant layer (25, 30) sets the $V_T$ and a leakage current, whereas the halo region (75, 79) sets the punchthrough voltage.

17 Claims, 5 Drawing Sheets

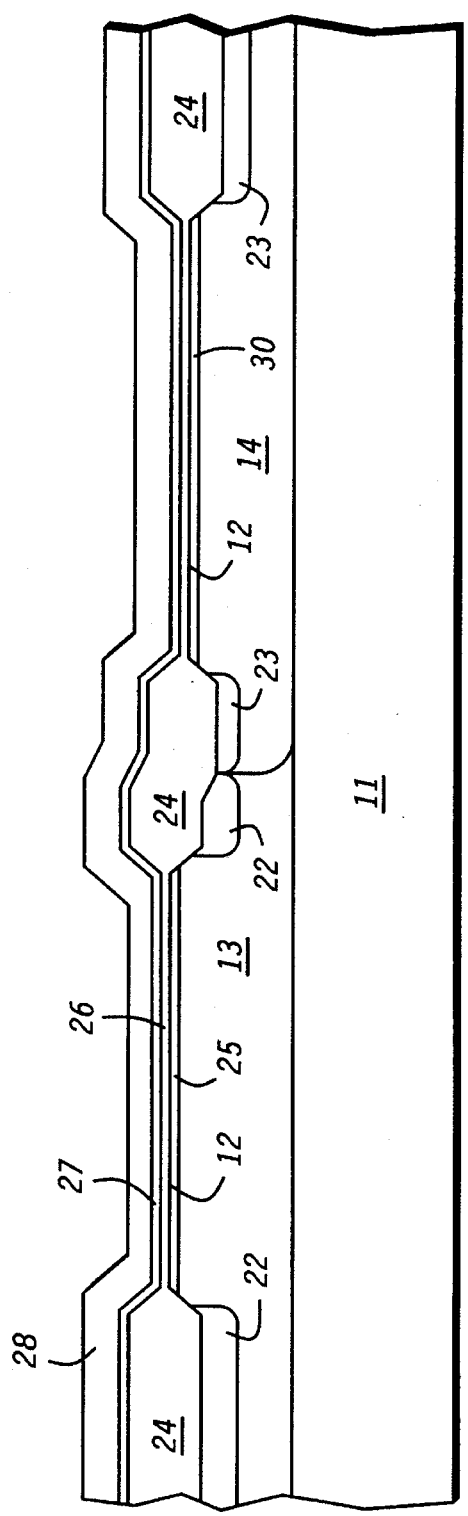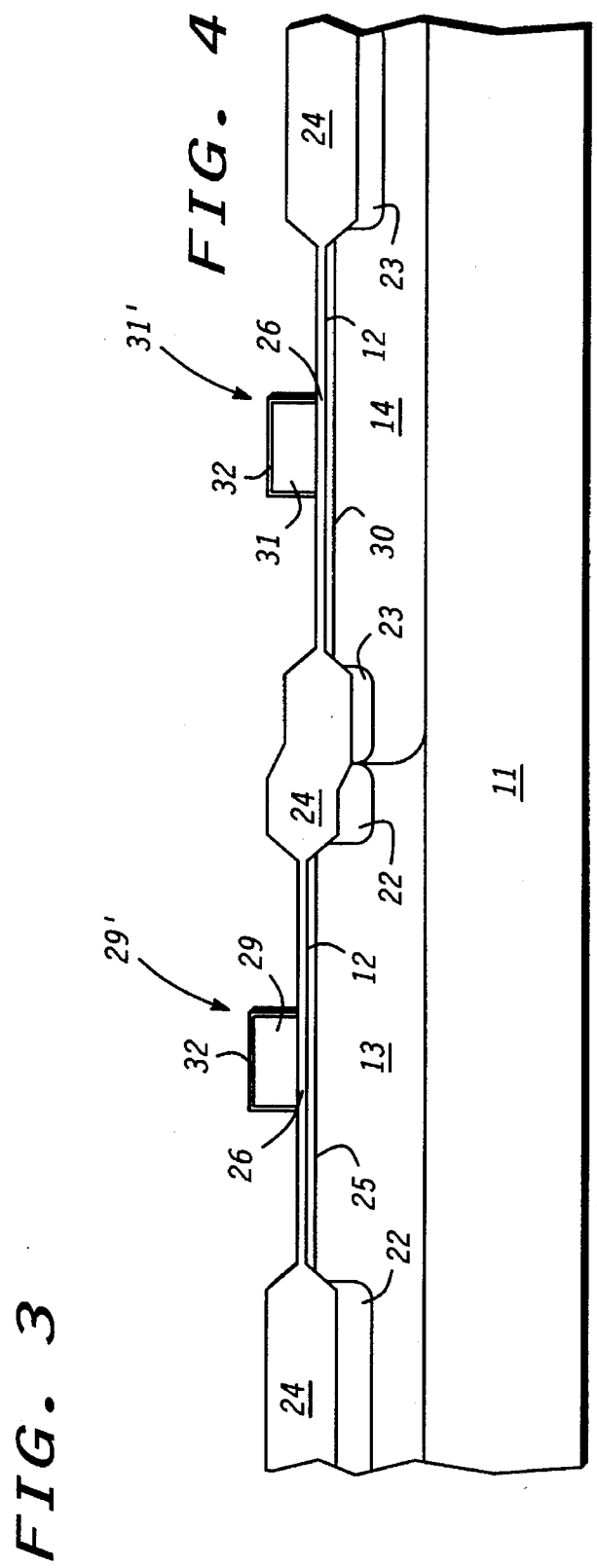

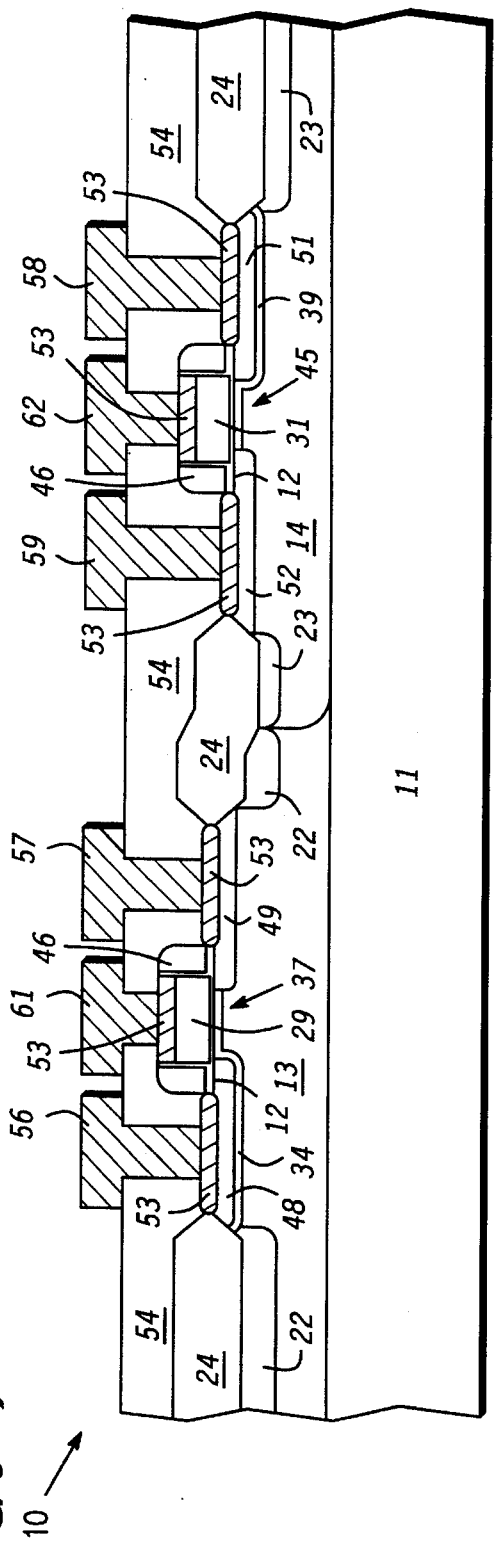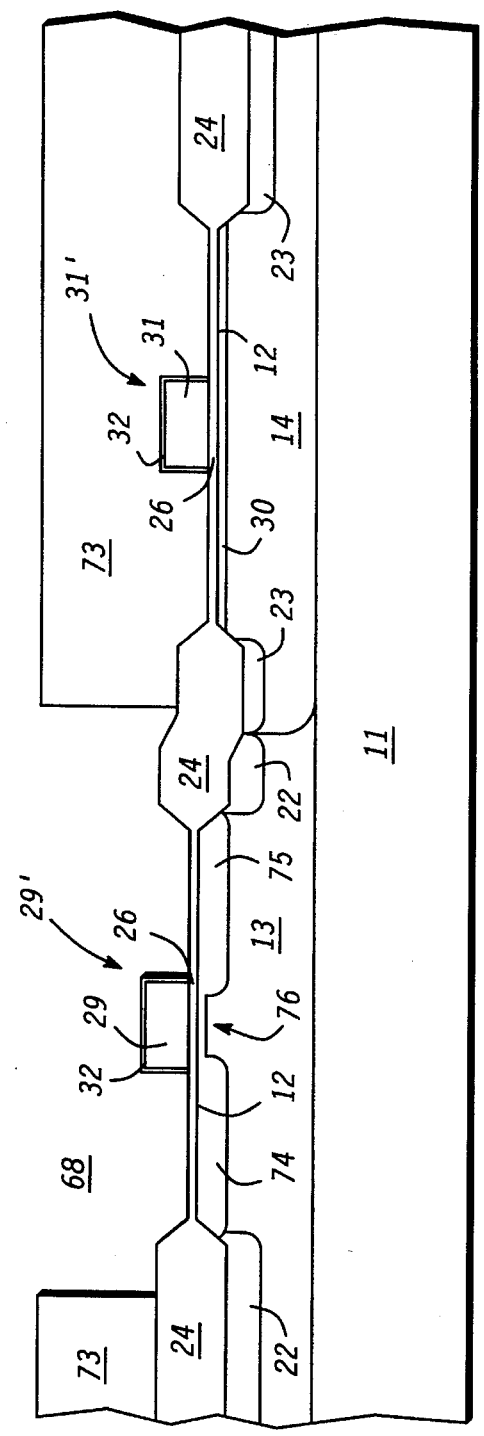

METHOD FOR FABRICATING INSULATED GATE FIELD EFFECT RANSISTOR HAVING SUBTHRESHOLD SWING

CROSS-REFERENCES TO RELATED APPLICATIONS

The present application is related to copending U.S. patent application Ser. No. 08/223,398, entitled "INSULATED GATE FIELD EFFECT TRANSISTOR HAVING A PARTIAL CHANNEL AND METHOD FOR FABRICATING," filed Apr. 4, 1994, by Vida Ilderem Burger and assigned to the same assignee, Motorola, Inc.

The present application is further related to copending U.S. patent application Ser. No. 08/223,394, entitled "INSULATED GATE FIELD EFFECT TRANSISTOR AND METHOD FOR FABRICATING", filed Apr. 4, 1994, by Michael H. Kaneshiro et al. and assigned to the same assignee, Motorola, Inc.

BACKGROUND OF THE INVENTION

Insulated gate field effect transistors are becoming increasingly important in low voltage and low power applications such as portable communications and portable computers, i.e., pagers, cellular phones, digital logic, memories, etc. Since low power consumption is a primary goal in these applications, these types of transistors are typically designed to operate at supply voltages of less than 3.5 volts. However, their subthreshold characteristics limit the minimum supply voltages at which these transistors are capable of reliably operating. More particularly, when the gate-to-source voltage is below the threshold voltage, the channel current decreases approximately exponentially with a decreasing gate voltage rather than becoming zero. Thus, current flows (hence power is consumed) even when the gate-to-source voltage is less than the threshold voltage.

A parameter commonly used to characterize the performance of insulated gate field effect transistors in the subthreshold region is the subthreshold swing. The subthreshold swing refers to the change in the gate-to-source voltage required to change the drain current by an order of magnitude. Insulated gate field effect transistors having high subthreshold swing values have large leakage currents and consume relatively large amounts of standby power. Insulated gate field effect transistors having low subthreshold swing values, on the other hand, have low leakage currents, consume less power, and are more ideally suited for low power applications.

Accordingly, it would be advantageous to have a method for fabricating insulated gate field effect transistors that reduces their subthreshold swing. It would be of further advantage for the method to be easily integrated into insulated gate field effect transistor process flows.

BRIEF DESCRIPTION OF THE DRAWINGS

FIGS. 1–4 illustrate enlarged cross-sectional views of a portion of an insulated gate field effect transistor during beginning stages of fabrication in accordance with unilateral and bilateral embodiments of the present invention;

FIGS. 5–7 illustrate enlarged cross-sectional views of an insulated gate field effect transistor during fabrication in accordance with the unilateral embodiment of the present invention; and FIGS. 8–10 illustrate enlarged cross-sectional views of an insulated gate field effect transistor during fabrication in accordance with the bilateral embodiment of the present invention.

DETAILED DESCRIPTION OF THE DRAWINGS

Generally, the present invention provides a semiconductor device such as an insulated gate field effect transistor and a method of fabricating or forming the transistor. More particularly, the method allows fabrication of insulated gate semiconductor devices having low subthreshold swings by providing a dopant region containing a source or a drain region and coupling a drain or a source region, respectively, to the dopant region by a portion of a dopant layer. The portion of the dopant layer coupling the dopant region to the drain or source region serves as a channel region. The dopant region containing the source or the drain region is also referred to as a halo or a pocket region. The method of the present invention allows performing the steps of setting the threshold voltage ($V_T$) and the device leakage current independently from the steps for providing punchthrough protection. In other words, the process steps for setting the $V_T$ and the device leakage current are decoupled from the process steps for providing punchthrough protection.

Insulated gate semiconductor devices fabricated in accordance with the present invention may be manufactured as unsymmetrical devices (unilateral embodiment) or as symmetrical devices (bilateral embodiment). In the unilateral embodiment, the halo region surrounds either the source region or the drain region of the insulated gate semiconductor device, whereas in the bilateral embodiment, the halo region surrounds both the source and drain regions of the insulated gate semiconductor device. In both the unilateral and bilateral embodiments, the portion of the dopant layer coupling the source region to the drain region extends a depth (d) into a semiconductor substrate from a major surface. Depth (d) is determined by the relationship:

$$d < 2 \times \lambda_d \times \ln (N_s/n_i)^{1/2}$$

where:

$\lambda_d = (\epsilon_s \times \epsilon_o \times K \times T/(q^2 \times N_s))^{1/2}$ and is referred to as a Debye length;

$n_i$ is the intrinsic carrier concentration;

$\epsilon_s$ is the silicon permittivity;

$\epsilon_o$ is the dielectric constant;

K is Boltzmann's constant;

q is the electronic charge; and $N_s$ is the surface concentration.

The Debye length is well known to those skilled in the art.

Figure 1:
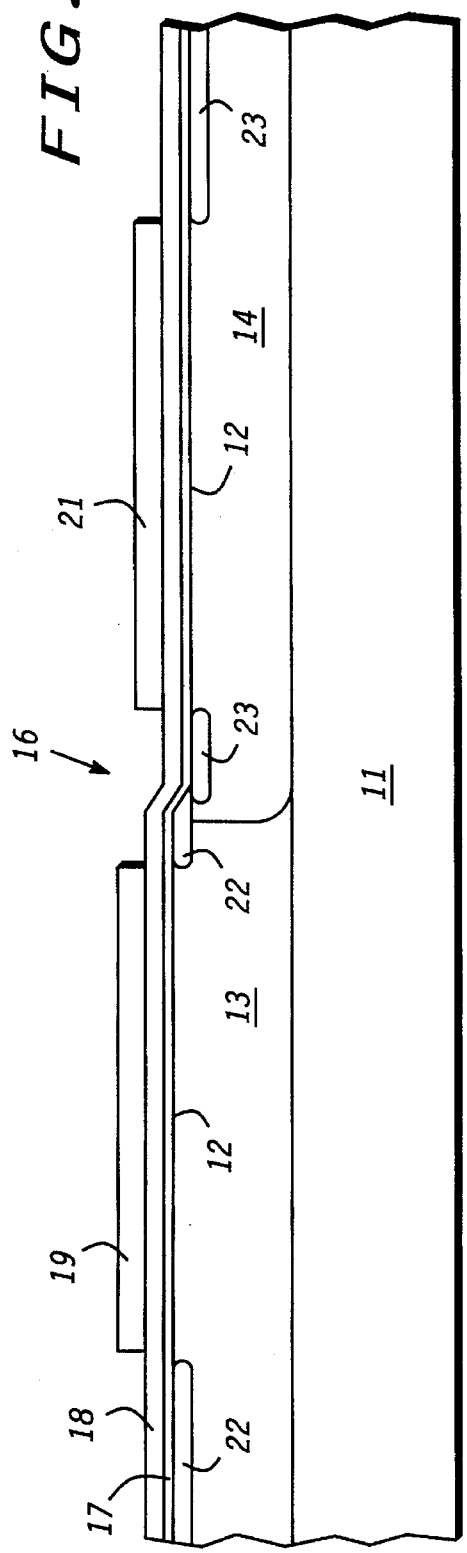

FIG. 1 illustrates an enlarged cross-sectional view of a portion of a partially completed low power insulated gate field effect transistor during processing in accordance with the unilateral embodiment of the present invention. What is shown in FIG. 1 is a semiconductor material or substrate 11 of P-conductivity type having a major surface 12. An impurity well 13 of P⁻-conductivity type, commonly referred to as a P-well, extends into semiconductor substrate 11 from a first portion of major surface 12 and an impurity well 14 of N⁻-conductivity type extends into substrate 11 from a second portion of major surface 12. P-well 13 laterally abuts N-well 14. Further, a step 16 is formed after the formation of N-well 14 and before the formation of P-well 13. Methods of forming wells 13 and 14 are commonly referred to as twin well processes and typically result in the formation of bird's beaks 16. Twin well processes and bird's beak formation are well known to those skilled in the art. By way of example, substrate 11 has a resistivity between approximately 6 ohm-centimeter (Ω-cm) and approximately 8 Ω-cm, and wells 13 and 14 have a surface concentration on the order of $1 \times 10^{16}$ atoms per cubic centimeter (atoms/cm$^3$).

Using techniques well known to those skilled in the art, a layer of oxide 17 is formed on major surface 12, a layer of polysilicon 18 is formed on oxide layer 17, and a layer of nitride (not shown) is formed on layer of polysilicon 18. The layer of nitride is patterned to form islands over active areas or regions in which transistors are to be fabricated. Although the layer of nitride is not shown, a first portion 19 of the nitride layer serves as one island and a second portion 21 serves as another island. Additionally, layer of oxide 17, layer of polysilicon 18, and the layer of nitride form implant block masks over portions of wells 13 and 14. More particularly, first portion 19 serves as an implant block mask over a portion of P-well 13 and second portion 21 serves as an implant block mask over a portion of N-well 14.

An additional implant block mask (not shown) of, for example, photoresist is formed over N-well 14. An impurity material of P conductivity type is implanted into portions of P-well 13 not protected by the implant block mask to form dopant regions 22. This implant block mask is removed and another implant block mask (not shown) of, for example, photoresist is formed over P-well 13 and dopant regions 22. An impurity material of N conductivity type is implanted into portions of N-well 14 not protected by the implant block mask to form dopant regions 23. Dopant regions 22 and 23 prevent inversion under field oxide regions 24 (shown in FIG. 2) and provide isolation punchthrough protection.

Figure 2:
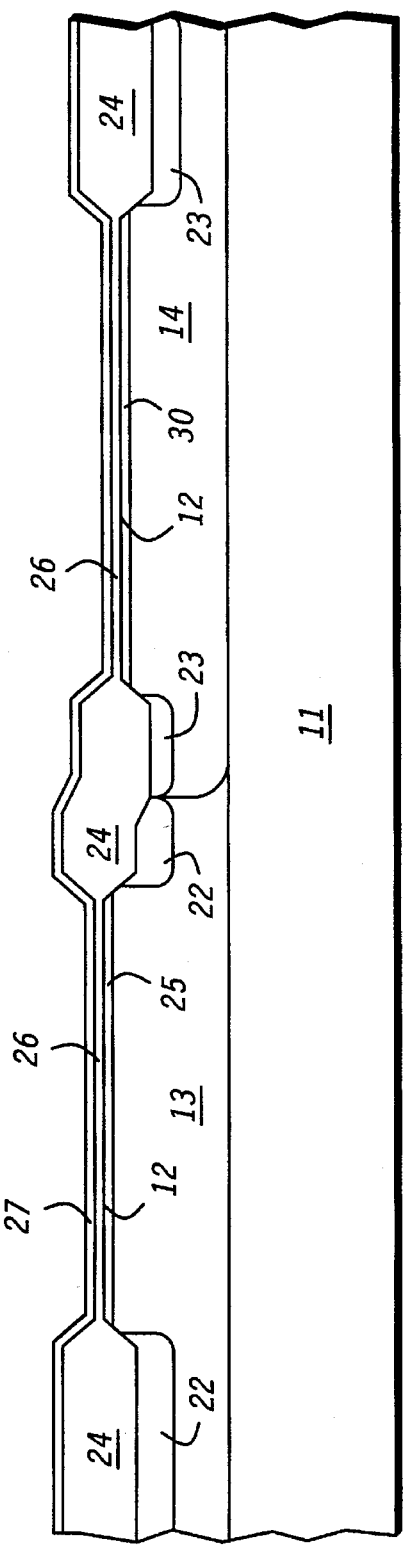

FIG. 2 illustrates an enlarged cross-sectional view of the portion of the partially completed low power insulated gate field effect transistor of FIG. 1 further along in processing. It shall be understood that the same reference numerals are used in the figures to denote the same elements. It shall be further understood that the concentrations and thicknesses provided in the description of the present invention merely serve as exemplary values and are not limitations of the present invention. An anneal is performed that forms field oxide regions 24 and drives in the impurity material of dopant regions 22 and 23, thereby enlarging dopant regions 22 and 23. Methods of forming dopant regions 22 and 23 are well known to those skilled in the art.

Portions 19 and 21 of the nitride layer, polysilicon layer 18 and oxide layer 17 are removed using techniques well known to those skilled in the art. A layer of sacrificial oxide (not shown) is grown on major surface 12 and on field oxide regions 24. By way of example, the sacrificial oxide layer has a thickness of approximately 400 angstroms. The sacrificial oxide layer serves to oxidize any silicon nitride film formed during field oxidation (Kooi effect) around the active region edges.

The sacrificial oxide layer is removed and a layer of gate oxide 26 is formed on major surface 12 and on field oxide regions 24. A layer of polysilicon 27 is formed on gate oxide layer 26 and serves to protect gate oxide layer 26 from implant damage during subsequent processing steps. By way of example, gate oxide layer 26 has a thickness of approximately 105 angstroms and polysilicon layer 27 has a thickness of approximately 500 angstroms. An implant block mask (not shown) such as, for example, photoresist is formed over N-well 14 and an impurity material of P conductivity type is implanted into P-well 13 to form a dopant layer 25. Preferably, dopant layer 25 is between two adjacent field oxide regions 24. Subsequently, the implant block mask over N-well 14 is removed, an implant block mask (not shown) such as, for example, photoresist is formed over P-well 13, and an impurity material of N conductivity type is implanted into N-well 14 to form a dopant layer 30. Dopant layer 30 is also between two adjacent field oxide regions 24. The implant block mask over N-well 14 is removed.

The depth and dopant concentrations of layers 25 and 30 are selected to set the $V_T$ of the insulated gate field effect transistors. For example, a $V_T$ selected in the range of approximately 400 millivolts (mV) to approximately 600 mV may be achieved by forming layers 25 and 30 to have a surface concentration ranging between approximately $7 \times 10^{16}$ atoms/cm$^3$ and approximately $2 \times 10^{17}$ atoms/cm$^3$. A suitable set of implant conditions to obtain this surface concentration includes an implant dose ranging between approximately $1 \times 10^{12}$ atoms/cm$^2$ and approximately $3 \times 10^{12}$ atoms/cm$^2$, an implant energy for forming dopant layer 25 ranging between approximately 20 kilo-electron volts (KEV) and approximately 30 KeV, and the implant energy for forming dopant layer 30 ranging between approximately 70 KeV and approximately 90 KeV. As those skilled in the art will understand, a specific value for $V_T$ is a design choice and is obtained in accordance with dose and implant energies used in the formation of dopant layers 25 and 30.

Now referring to FIG. 3, a layer of polysilicon 28 is formed on polysilicon layer 27. By way of example, polysilicon layer 28 has a thickness of approximately 3,000 angstroms. Polysilicon layer 28 serves as a gate conductor layer. Methods for forming gate oxide layers such as gate oxide layer 26 and polysilicon layers such as polysilicon layer 28 are well known to those skilled in the art. In addition, the techniques used in preparation for the formation of gate oxide layer 26 and polysilicon layer 28, i.e., formation of a sacrificial oxide layer and polysilicon layer 27 are also known in the semiconductor processing art.

FIG. 4 illustrates an enlarged cross-sectional view of the portion of the partially completed low power insulated gate field effect transistor of FIG. 3 further along in processing. Layer of polysilicon 28 is patterned to form polysilicon gate electrodes 29 and 31 over P-well 13 and N-well 14, respectively. Gate electrodes 29 and 31 in conjunction with the portions of gate oxide layer 26 between major surface 12 and gate electrodes 29 and 31 form gate structures 29' and 31' An oxide layer 32 is formed on polysilicon gate electrodes 29 and 31. As those skilled in the art are aware, oxide layer 32 serves to re-grow the portions of gate oxide layer 26 that have been undercut.

Figure 5:
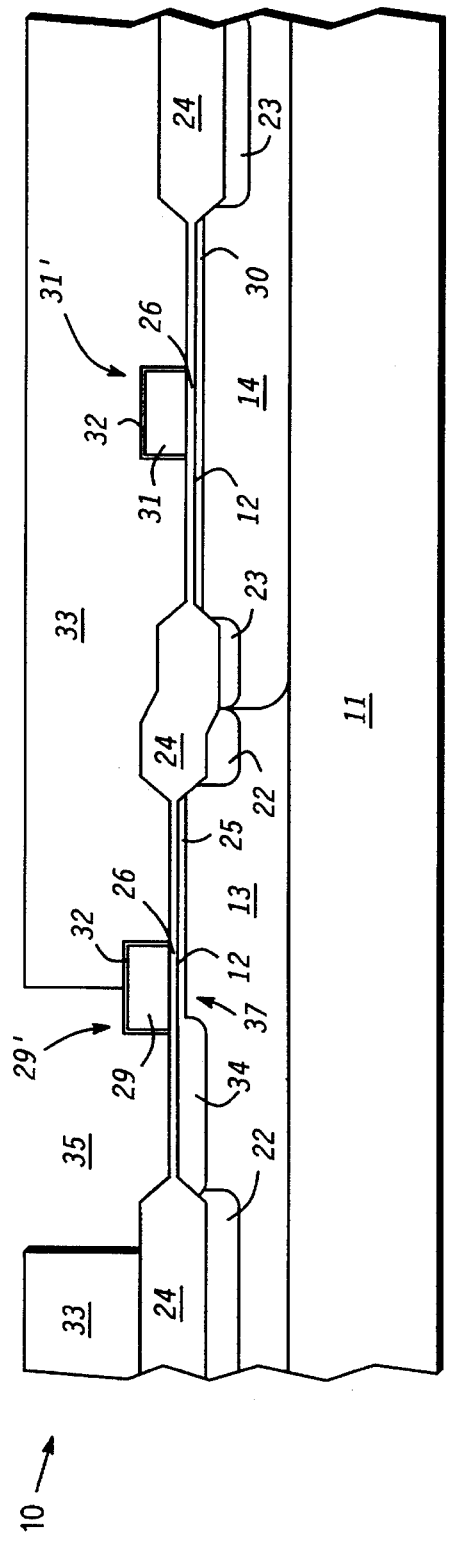

FIG. 5 illustrates an enlarged cross-sectional view of the portion of the partially completed complementary low power insulated gate field effect transistor 10. It shall be understood that the processing steps described in FIGS. 1–4 are common to both the unilateral insulated gate field effect transistor and the bilateral insulated gate field effect transistor. FIGS. 5-8, on the other hand, describe a method of fabricating an insulated gate field effect transistor in accordance with the unilateral embodiment of the present invention. An implant block mask 33 of, for example, photoresist is formed on layer of oxide 32. Photoresist 33 is patterned to form a window 35 which exposes layer of oxide 32 over a portion of polysilicon gate electrode 29 and a portion of oxide layer 32 covering P-well 13. The exposed portion of oxide layer 32 covering P-well 13 is adjacent to one side of polysilicon gate electrode 29. An impurity material of P conductivity type such as, for example, boron is implanted into a portion of P well 13 using a zero degree implant to form a dopant region 34. Dopant region 34 is also referred to as a halo or pocket region. Implant block mask 33 is removed using techniques well known to those skilled in the art.

By way of example, dopant region 34 has a surface concentration of approximately $3 \times 10^{18}$ atoms/cm$^3$ and extends approximately 0.6 micron (μm) into dopant well 13 from major surface 12. It shall be understood that the implant energy is set so that the impurity material of P conductivity type does not penetrate gate structure 29'. Thus the P-type impurity material is not implanted into portion 37 of dopant layer 25. The concentration of the P-type impurity material of dopant region 34 is much greater than that of dopant layer 25, thus the portion of dopant region 25 through which dopant region 34 extends becomes a part of dopant region 34. Accordingly, dopant region 34 is aligned to a first side of gate structure 29', wherein a portion of dopant region 34 extends below gate structure 29' and is contiguous with portion 37 of dopant layer 25, i.e., the portion of dopant layer 25 below gate structure 29'.

Figure 6:
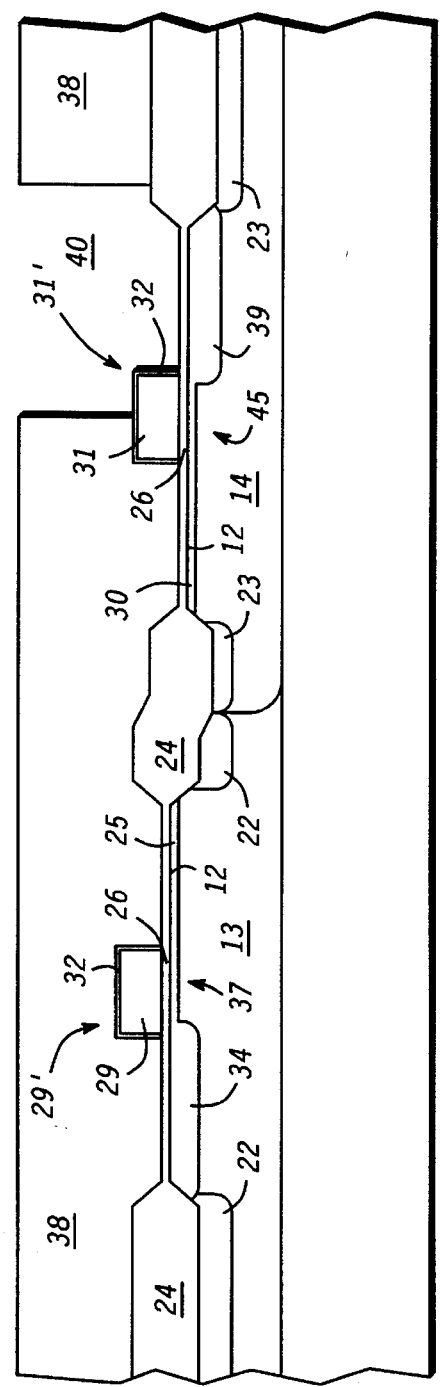

Referring now to FIG. 6, an implant block mask 38 of, for example, photoresist is formed on layer of oxide 32. Photoresist 38 is patterned to form a window 40 which exposes layer of oxide 32 over a portion of polysilicon gate electrode 31 and a portion of oxide layer 32 covering N-well 14. An impurity material of N conductivity type such as, for example, phosphorus is implanted into a portion of N-well 14 using a zero degree implant to form a dopant region 39. Dopant region 39 is also referred to as a halo or pocket region.

By way of example, dopant region 39 has a surface concentration of approximately $3 \times 10^{18}$ atoms/cm$^3$ and extends approximately 0.6 μm into dopant well 14 from major surface 12. It shall be understood that the implant energy is set so that the impurity material of N conductivity type does not penetrate gate structure 31'. Thus, the N-type impurity material is not implanted into portion 45 of dopant layer 30. The concentration of the N-type impurity material of dopant region 39 is much greater than that of dopant layer 30, thus the portion of dopant layer 30 through which dopant region 39 extends becomes a part of dopant region 39. Accordingly, dopant region 39 is aligned to a first side of gate structure 31', wherein a portion of dopant region 39 extends below gate structure 31' and is contiguous with portion 45 of dopant layer 30, i.e., the portion of dopant layer 30 below gate structure 31' Implant block mask 38 is removed. Techniques for forming and removing implant block masks such as masks 33 and 38 are well known to those skilled in the art.

FIG. 7 illustrates an enlarged cross-sectional view of the portion of the complementary low power insulated gate field effect transistor 10 of FIG. 6 further along in processing. Source and drain regions 48 and 49, respectively, are formed in portions of P-well 13 adjacent polysilicon gate electrode 29. More particularly, source region 48 is contained within halo region 34. Source and drain regions 48 and 49, respectively, are of N conductivity type and are formed using, for example, zero degree arsenic implant. Simultaneously with the formation of source and drain regions 48 and 49, respectively, polysilicon gate electrode 29 is doped to be of N conductivity type, e.g., doped with arsenic.

Further, source and drain regions 51 and 52, respectively, are formed in N-well 14 adjacent polysilicon gate electrode 31. Source and drain regions 51 and 52, respectively, are of P conductivity type and formed using, for example, zero degree boron implant. Simultaneously with the formation of source and drain regions 51 and 52, respectively, polysilicon gate electrode 31 is doped to be of P conductivity type, e.g., doped with the boron. In accordance with the earlier described embodiment for source and drain regions 48 and 49, respectively, source region 51 is formed in halo region 39. By way of example, regions 48, 49, 51, and 52 extend between approximately 0.2 μm and approximately 0.3 μm from major surface 12 into their respective wells 13 and 14. Preferably, at the intersection of the regions 48 and 51 with 34 and 39, respectively, the dopant concentration ranges from approximately $5 \times 10^{16}$ atoms/cm$^3$ to approximately $1 \times 10^{18}$ atoms/cm$^3$.

Although it is preferable that source regions 48 and 51 be contained within halo regions 34 and 39, respectively, it shall be understood that alternatively drain regions 49 and 52 are contained within halo regions 34 and 39, respectively, or a source region is contained within a halo region and a drain region is contained within another halo region. Methods of forming source and drain regions such as regions 48, 49, 51, and 52 are well known to those skilled in the art. An oxide layer (not shown) is formed on oxide layer 32. The oxide layer has a thickness on the order of 300 angstroms and may be formed by well known processes such as a tetraethylorthosilicate (TEOS) deposition process. Using techniques well known in the art, dielectric spacers 46 are formed along oxide layer 32 lining the sidewalls of polysilicon gate electrodes 29 and 31. By way of example, spacers 46 are nitride spacers.

Still referring to FIG. 7 and using techniques well known to those skilled in the art, electrodes are formed which contact regions 48, 49, 51, and 52. For example, a silicide 53 may be formed in source regions 48 and 51, drain regions 49 and 52 and in polysilicon gate electrodes 29 and 31o Nitride spacers 46 prevent source and drain regions 48 and 49, respectively, from being shorted with polysilicon gate electrode 29 after silicidation. Further, nitride spacers 46 prevent source and drain regions 51 and 52, respectively, from being shorted with polysilicon gate electrode 31 after silicidation. An insulating layer 54 is formed on device 10, i.e., on field oxide regions 24, source regions 48 and 51, drain regions 49 and 52, and polysilicon gate electrodes 29 and 31. A plurality of openings (not shown) are formed in insulating layer 54 to expose portions of silicide 53 in source regions 48 and 51, drain regions 49 and 52, and polysilicon gate electrodes 29 and 31. Source and drain electrodes 56 and 57, respectfully, are formed to contact the silicide 53 in the respective source and drain regions 48 and 49. Source and drain electrodes 58 and 59, respectively, are formed to contact the silicide 53 in the respective source and drain regions 51 and 52. Gate electrodes 61 and 62 are formed to contact the silicide on polysilicon gate electrodes 29 and 31, respectively. Methods of forming electrodes to silicided regions are well known to those skilled in the art.

Thus, the unilateral embodiment of the present invention comprises a method for fabricating complementary insulated gate semiconductor device 10 having source regions 48 and 51, drain regions 49 and 52, and gate electrodes 29 and 31. Although a complementary unilateral low power insulated gate semiconductor device 10 has been described, it shall be understood that individual unilateral N-channel and P-channel insulated gate semiconductor devices may also be fabricated in accordance with the present invention.

Figure 9:
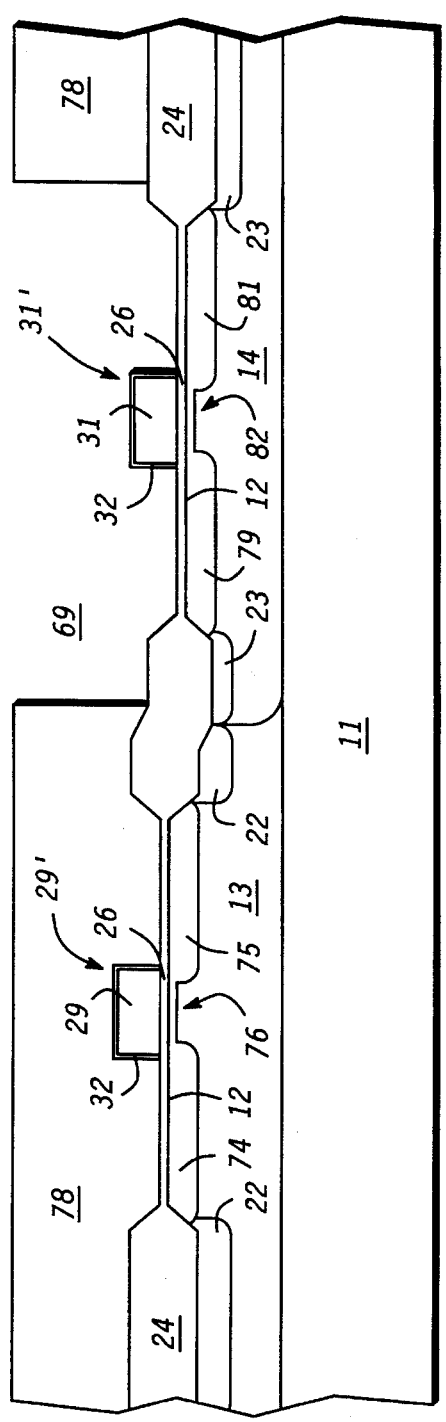
Figure 10:
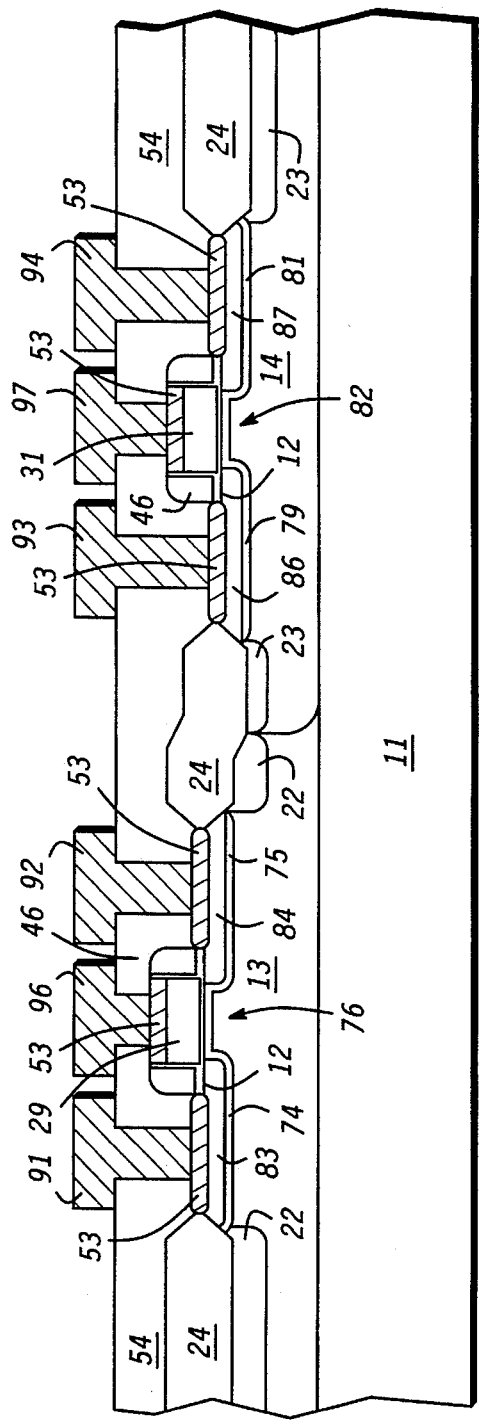

FIGS. 8–10 illustrate enlarged cross-sectional views of a portion of a complementary low power insulated gate semiconductor device 70 in accordance with a bilateral embodiment of the present invention during various stages of processing. More particularly, FIG. 8 illustrates an enlarged cross-sectional view of a portion of the partially completed complementary low power insulated gate semiconductor device of FIG. 4 further along in processing. As discussed supra, FIGS. 1–4 are common to both the unilateral and bilateral embodiments of the present invention, thus the unilateral embodiment 10 is illustrated in FIGS. 5–7 and the bilateral embodiment 70 is illustrated in FIGS. 8–10. Still referring to FIG. 8, an implant block mask 73 of, for example, photoresist is formed on layer of oxide 32. Photoresist 73 is patterned to form a window 68 which exposes layer of oxide 32 over polysilicon gate electrode 29 and the portion of oxide layer 32 covering P-well 13.

An impurity material of P conductivity type such as, for example, boron is implanted into a portion of P well 13 using a zero degree implant to form dopant regions 74 and 75. Dopant regions 74 and 75 are also referred to as halo or pocket regions. By way of example, dopant regions 74 and 75 have a surface concentration of approximately $3 \times 10^{18}$ atoms/cm$^3$ and extend approximately 0.6 µm into dopant well 13 from major surface 12. It shall be understood that the implant energy is set so that the impurity material of P conductivity type does not penetrate gate electrode 29. Thus the P type impurity material is not implanted into portion 76 of dopant layer 25. The concentration of the impurity material of P conductivity type of dopant regions 74 and 75 is much greater than that of dopant layer 25, thus the portions of dopant region 25 through which dopant regions 74 and 75 extend becomes part of dopant regions 74 and 75. Accordingly, dopant region 74 is aligned to a first side of gate structure 29', wherein a portion of dopant region 74 extends below gate structure 29' and is contiguous with portion 76 of dopant layer 25, i.e., the portion of dopant layer 25 below gate structure 29' Further, dopant region 75 is aligned to a second side of gate structure 29', wherein a portion of dopant region 75 extends below gate structure 29' and is contiguous with portion 76 of dopant layer 25, i.e., the portion of dopant layer 25 below gate structure 29' Implant block mask 73 is removed.

Referring now to FIG. 9, an implant block mask 78 of, for example, photoresist is formed on layer of oxide 32. Photoresist 78 is patterned to form a window 69 which exposes layer of oxide 32 over polysilicon gate electrode 31 and oxide layer 32 covering N-well 14. An impurity material of N conductivity type such as, for example, phosphorus is implanted into a portion of N-well 14 using a zero degree implant to form dopant regions 79 and 81. Dopant regions 79 and 81 are also referred to as halo or pocket regions. By way of example, dopant regions 79 and 81 have a surface concentration of approximately $3 \times 10^{18}$ atoms/cm$^3$ and extend approximately 0.6 µm into dopant well 13 from major surface 12. It shall be understood that the implant energy is set so that the impurity material of N conductivity type does not penetrate gate electrode 31. Thus N-type impurity material is not implanted into portion 82 of dopant layer 30. The concentration of the impurity material of N conductivity type of dopant regions 79 and 81 is much greater than that of dopant layer 30, thus the portions of dopant region 30 through which dopant regions 79 and 81 extend become a part of dopant regions 79 and 81. Accordingly, dopant region 79 is aligned to a second side of gate structure 31', wherein a portion of dopant region 79 extends below gate structure 31' and is contiguous with portion 82 of dopant layer 30, i.e., the portion of dopant layer 30 below gate structure 31'. Further, dopant region 81 is aligned to a first side of gate structure 31', wherein a portion of dopant region 81 extends below gate structure 31' and is contiguous with portion 82 of dopant layer 30, i.e., the portion of dopant layer 30 below gate structure 31' Implant block mask 78 is removed. Techniques for forming and removing implant block masks such as masks 73 and 78 are well known to those skilled in the art.

FIG. 10 illustrates an enlarged cross-sectional view of the portion of the complementary low power insulated gate semiconductor device 70 of FIG. 9 further along in processing. Source and drain regions 83 and 84, respectively, are formed in P-well 13 adjacent polysilicon gate electrode 29. More particularly, source region 83 is contained within halo region 74 and drain region 84 is contained within halo region 75. Source and drain regions 83 and 84, respectively, are of N conductivity type and formed using, for example, zero degree arsenic implant. Simultaneously with the formation of source and drain regions 83 and 84, respectively, polysilicon gate electrode 29 is doped to be of N conductivity type, e.g., doped with arsenic.

Further, source and drain regions 86 and 87, respectively, are formed in N-well 14 adjacent polysilicon gate electrode 31. Source and drain regions 86 and 87, respectively, are of P conductivity type and formed using, for example, zero degree boron implant. Simultaneously with the formation of source and drain regions 86 and 87, respectively, polysilicon gate electrode 31 is doped to be of P conductivity type, e.g., doped with boron. In accordance with the earlier described embodiment for source and drain regions 83 and 84, respectively, source region 86 is formed within halo region 79 and drain region 87 is formed within halo region 81. By way of example, regions 83, 84, 86, and 87 extend between approximately 0.2 µm and approximately 0.3 µm into their respective wells 13 and 14 from major surface 12. Preferably, at the intersection of the regions 83 and 84 with 74 and 75, respectively, and 86 and 87 with 79 and 81, respectively, the dopant concentration ranges from approximately $5 \times 10^{16}$ atoms/cm$^3$ to approximately $1 \times 10^{18}$ atoms/cm$^3$. Methods of forming source and drain regions such as regions 83, 84, 86, and 87, respectively, are well known to those skilled in the art. An oxide layer (not shown) is formed on oxide layer 32. The oxide layer has a thickness on the order of 300 angstroms and may be formed by well known processes such as a tetraethylorthosilicate (TEOS) deposition process. Using techniques well known in the art, dielectric spacers 46 are formed along the portions of oxide layer 32 lining the sidewalls of polysilicon gate electrodes 29 and 31. By way of example, spacers 46 are nitride spacers.

Still referring to FIG. 10 and using techniques well known to those skilled in the art, electrodes are formed which contact regions 83, 84, 86, and 87. For example, a silicide 53 may be formed in source regions 83 and 86, drain regions 84 and 87, and in polysilicon gate electrodes 29 and 31. Nitride spacers 46 prevent source and drain regions 83 and 84, respectively, from being shorted with polysilicon gate electrode 29 and source and drain regions 87 and 86, respectively, from being shorted with polysilicon gate electrode 31 after silicidation. An insulating layer 54 is formed on field oxide regions 24, source regions 83 and 86, drain regions 84 and 87, and polysilicon gate electrodes 29 and 31. A plurality of openings (not shown) are formed in insulating layer 54 to expose portions of silicide 53 in source regions 83 and 86, drain regions 84 and 87, and polysilicon gate electrodes 29 and 31. Source and drain electrodes 91 and 92 are formed to contact the silicide 53 in the respective source and drain regions 83 and 84, source and drain electrodes 94 and 93 are formed to contact the silicide 53 in the respective source and drain regions 86 and 87, and gate electrodes 96 and 97 are formed to contact the silicide on polysilicon gate electrodes 29 and 31, respectively. Methods of forming electrodes to silicided regions are well known to those skilled in the art.

Thus, the bilateral embodiment of the present invention comprises a method for fabricating complementary insulated gate field effect transistor 70 having source regions 83 and 86, drain regions 84 and 87, and gate electrodes 29 and 31. Although a complementary low power insulated gate field effect transistor 70 has been described, it shall be understood that individual bilateral N-channel and P-channel insulated gate field effect transistors may also be fabricated in accordance with the present invention.

By now it should be appreciated that a method of forming insulated gate semiconductor devices having a reduced subthreshold swing has been provided. The subthreshold swing is determined by the charge in the channel region. Both unilateral and bilateral devices have low subthreshold swings in the range of approximately 70–80 mV/decade of drain current. These low subthreshold swings permit lowering of the threshold voltage without compromising the leakage current. In addition, both the unilateral and bilateral devices have a low body effect, due to the light doping of the wells used in the process, as well as high saturation currents.

Other advantages of the unilateral device include a reduced drain capacitance, a reduced total capacitance (because of the absence of a drain halo region), and a lower body effect than the bilateral device. Accordingly, these devices are extremely attractive for low voltage and low power applications where low leakage currents and high performance is desirable.

We claim:

1. A method for fabricating an insulated gate field effect transistor which operates at a voltage less than 3.5 volts and has a subthreshold swing, comprising the steps of:

providing a semiconductor material of a first conductivity type having a major surface;

forming a dopant layer of the first conductivity type in a first region of the semiconductor material;

forming a gate structure having first and second sides on a portion of the major surface of the first region after forming the dopant layer of the first conductivity type, wherein the gate structure is over a portion of the dopant layer which extends at least from a portion of the semiconductor material aligned to the first side of the gate structure to a portion of the semiconductor material aligned to a second side of the gate structure;

forming a first dopant region of the first conductivity type in the semiconductor material, the first dopant region aligned to the first side of the gate structure, wherein a portion of the first dopant region extends below the gate structure and is contiguous with the portion of the dopant layer below a portion of the gate structure;

forming second and third dopant regions of a second conductivity type in the semiconductor material, the second dopant region contained within the first dopant region and the third dopant region aligned to the second side of the gate structure, wherein a portion of the second dopant region extends below another portion of the gate structure;

forming first and second electrodes, the first electrode in contact with the second dopant region and the second electrode in contact with the third dopant region; and forming a third electrode in contact with a portion of the gate structure.

2. The method of claim 1, wherein the step of forming the first and second electrodes further comprises:

forming a first spacer adjacent the first side of the gate structure; and forming a second spacer adjacent the second side of the gate structure, wherein the first spacer electrically separates the first electrode from the gate structure and the second spacer electrically separates the second electrode from the gate structure.

3. The method of claim 1, wherein the steps of forming a dopant layer, forming a first dopant region, and forming second and third dopant regions further include forming the dopant layer a first distance into the semiconductor material from the major surface, forming the first dopant region a second distance into the semiconductor material from a portion of the major surface proximal to the first side of the gate structure, forming the second dopant region a third distance into the semiconductor material from the portion of the major surface proximal to the first side of the gate structure, and forming the third dopant region a fourth distance into the semiconductor material from a portion of the major surface proximal to the second side of the gate structure.

4. The method of claim 3, further including forming the first distance to be less than the second, third, and fourth distances.

5. The method of claim 3, further including forming the first distance to be less than the product of twice the Debye length and the natural logarithm of the square root of a ratio of a surface concentration to an intrinsic carrier concentration.

6. The method of claim 1, further including forming a fourth dopant region of the first conductivity type in the semiconductor material, the fourth dopant region aligned to the second side of the gate structure and contiguous with the portion of the dopant layer below the gate structure.

7. The method of claim 6, further including forming the first and fourth dopant regions to have a greater dopant concentration than the dopant layer.

8. A method for setting a subthreshold swing of an insulated gate field effect transistor during fabrication of the insulated gate field effect transistor, comprising the steps of:

providing a semiconductor material having a major surface, wherein the semiconductor material has a first dopant region of a first conductivity type and a second dopant region of a second conductivity type;

forming a first dopant layer of the first conductivity type in the first dopant region;

forming a second dopant layer of the second conductivity type in the second dopant region;

forming a first gate structure on a portion of the first dopant layer and a second gate structure on a portion of the second dopant layer, the first and second gate structures each having first and second sides;

doping a first portion of the first dopant region with an impurity material of the first conductivity type, the first portion aligned to a first side of the first gate structure and contiguous with a portion of the first dopant layer covered by the first gate structure;

doping a sub-portion of the first portion of the first dopant region with an impurity material of the second conductivity type;

doping a second portion of the first dopant region with additional impurity material of the second conductivity type, the second portion aligned to a second side of the first gate structure;

doping a first portion of the second dopant region with yet additional impurity material of the second conductivity type, the first portion of the second dopant region aligned to a first side of the second gate structure and contiguous with a portion of the second dopant layer covered by the second gate structure;

doping a sub-portion of the first portion of the second dopant region with additional an impurity material of the first conductivity type;

doping a second portion of the second dopant region with yet additional impurity material of the first conductivity type, the second portion of the second dopant region aligned to a second side of the second gate structure;

forming a first electrode in contact with the sub-portion of the first dopant region and a second electrode in contact with the second portion of the first dopant region;

forming a third electrode in contact with the sub-portion of the first portion of the second dopant region and a fourth electrode in contact with the second portion of the second dopant region; and forming a fifth electrode in contact with a portion of the first gate structure and a sixth electrode in contact with a portion of the second gate structure.

9. The method of claim 8, wherein the step of doping the first portion of the first dopant region further includes doping a third portion of the first dopant region with the yet additional impurity material of the first conductivity type, the third portion of the first dopant region aligned to the second side of the first gate structure and containing the second portion of the first dopant region, and wherein the step of doping the first portion of the second dopant region further includes doping a third portion of the second dopant region with the yet additional impurity material of the second conductivity type, the third portion of the second dopant region aligned to the second side of the second gate structure and containing the second portion of the second dopant region.

10. The method of claim 8, wherein the steps of forming the first and second dopant layers further includes forming the first and second dopant layers to extend into the first and second dopant regions from the major surface, respectively, a distance less than the product of twice the Debye length and the natural logarithm of the square root of the ratio of the surface concentration to the intrinsic carrier concentration.

11. The method of claim 8, wherein the steps of forming a first electrode, a second electrode, a third electrode, and a fourth electrode include forming dielectric spacers adjacent the first and second sidewalls of the first gate structure and adjacent the first and second sidewalls of the second gate structure.

12. The method of claim 8, wherein the steps of doping a sub-portion of the first portion of the first dopant region and doping a sub-portion of the first portion of the second dopant region further comprise doping the sub-portions of the first portions of the first and second dopant regions to extend further into the first and second dopant regions, respectively, than the respective first and second dopant layers.

13. The method of claim 8, wherein the steps of doping the first and second portions of the first dopant region and doping the first and second portions of the second dopant region include doping the first and second portions of the first dopant region to have a higher dopant concentration than the first dopant layer and doping the first and second portions of the second dopant region to have a higher dopant concentration than the second dopant layer.

14. A method for fabricating an insulated gate field effect transistor, comprising the steps of:

providing a semiconductor material of a first conductivity type having a major surface;

forming a doped first portion of a first region of the semiconductor material;

forming a first gate structure on the doped first portion of the first region of the semiconductor material, the first gate structure having first and second sides, wherein the first gate structure is over a portion of the dopant layer which extends at least from a portion of the semiconductor material aligned to the first side of the first gate structure to a portion of the semiconductor material aligned to a second side of the first gate structure;

forming a first dopant region in the semiconductor material, the first dopant region aligned to the first side of the first gate structure, extending under a first portion of the first gate structure, and contiguous with the doped first portion of the first region of the semiconductor material;

forming a second dopant region within the first dopant region;

forming a third dopant region in the semiconductor material, the third dopant region aligned to the second side of the first gate structure;

forming a first electrode in contact with the second dopant region;

forming a second electrode in contact with the third dopant region; and forming a third electrode in contact with the first gate structure.

15. The method of claim 14, wherein the step of forming a first dopant region in the semiconductor material includes forming a fourth dopant region aligned to the second side of the first gate structure, wherein the fourth dopant region contains the third dopant region and is contiguous with the doped first portion of the first region of the semiconductor material.

16. The method of claim 15, further comprising the steps of:

forming a dopant well of the second conductivity type in a second region of the semiconductor material;

forming a doped first portion of the dopant well;

forming a second gate structure on the doped first portion of the dopant well, the second gate structure having first and second sides, wherein the second gate structure is over a portion of the doped first portion which extends at least from a portion of the dopant well aligned to the first side of the second gate structure to a portion of the dopant well aligned to the second side of the second gate structure;

forming a fifth dopant region of the second conductivity type in the dopant well, wherein the fifth dopant region is aligned to the first side of the second gate structure, extends under a first portion of the second gate structure, and is contiguous with the doped first portion of the dopant well;

forming a sixth dopant region of the first conductivity type, wherein the sixth dopant region is aligned to the second side of the second gate structure;

forming a seventh dopant region of the first conductivity type, wherein the seventh dopant region is contained within the fifth dopant region;

forming a fourth electrode, wherein the fourth electrode is in contact with the sixth dopant region;

forming a fifth electrode, wherein the fifth electrode is in contact with the seventh dopant region; and forming a sixth electrode, wherein the sixth electrode is in contact with a portion of the second gate structure.

17. The method of claim 16, wherein the step of forming a fifth dopant region of the second conductivity type in the dopant well further comprises forming an eighth dopant region of the second conductivity type aligned to the second side of the second gate structure, wherein the eighth dopant region contains the sixth dopant region and is contiguous with the first doped first portion of the dopant well.

* * * * *